United States Patent [19]
Babineau et al.

[11] Patent Number: 6,003,689
[45] Date of Patent: Dec. 21, 1999

[54] PCB EJECTOR CAGE ASSEMBLY

[75] Inventors: Paul J. Babineau, Ashburnham; John W. Milley, Pepperell, both of Mass.

[73] Assignee: 3Com Corporation, Santa Clara, Calif.

[21] Appl. No.: 09/044,051

[22] Filed: Mar. 18, 1998

[51] Int. Cl.⁶ ................................................ A47G 19/08
[52] U.S. Cl. ...................................................... 211/41.17
[58] Field of Search ................................. 211/41.17, 26, 211/70.1; 361/736, 752, 754, 798, 801

[56] References Cited

U.S. PATENT DOCUMENTS

| | | | |
|---|---|---|---|
| 3,476,258 | 11/1969 | Dorsett | 211/41.17 |
| 4,092,699 | 5/1978 | Petrangelo | 211/41.17 X |
| 4,233,646 | 11/1980 | Leung et al. | 211/41.17 X |
| 4,580,192 | 4/1986 | Beun | 211/41.17 X |
| 4,758,928 | 7/1988 | Wierec et al. | 211/41.17 X |
| 4,996,631 | 2/1991 | Freehauf | 211/41.17 X |
| 5,402,319 | 3/1995 | Shumaker et al. | 211/41.17 X |
| 5,669,512 | 9/1997 | Joslin | 211/41.17 |
| 5,812,377 | 9/1998 | Golbach | 211/41.17 X |

*Primary Examiner*—David M. Purol
*Assistant Examiner*—Erica B. Harris
*Attorney, Agent, or Firm*—McGlew & Tuttle, P.C.

[57] ABSTRACT

A card cage ejector combination is provided including a card cage or housing for receiving printed circuit boards. The housing has an opening for insertion of the PCBs. The ejector mechanism is formed preferably with a single sheet metal piece including a lever/handle portion, a pivot portion, a PCB engagement element and a transmission portion extending from the pivot portion to the PCB engagement portion. The card cage includes a pivot support which is formed by protruding a portion of the sheet metal of the card cage. The pivot portion of the ejector then cooperates with the protruding pivot support and the ejector level can pivot about the pivot support. A fixing portion is also formed from the sheet metal of the card cage. An opening is provided in the card cage adjacent to the pivot support and adjacent to the fixing portion. The PCB engagement portion of the ejector lever is inserted into the opening and the pivot portion is mounted on the pivot support. The ejector may be moved from a first non-fixed position, wherein the PCB board is not fixed, to a fixed position wherein the PCB board is fixed. In the fixed position, the fixing portion of the cage frictionally engages the ejector lever for maintaining it in position mounted on the pivot support. The ejector lever and card cage hold the PCB in a fixed position without the use of retaining fasteners for retaining the ejector relative to the card cage.

18 Claims, 7 Drawing Sheets

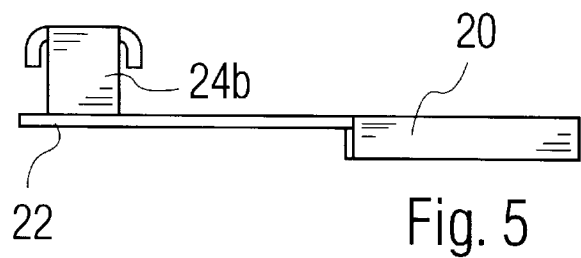
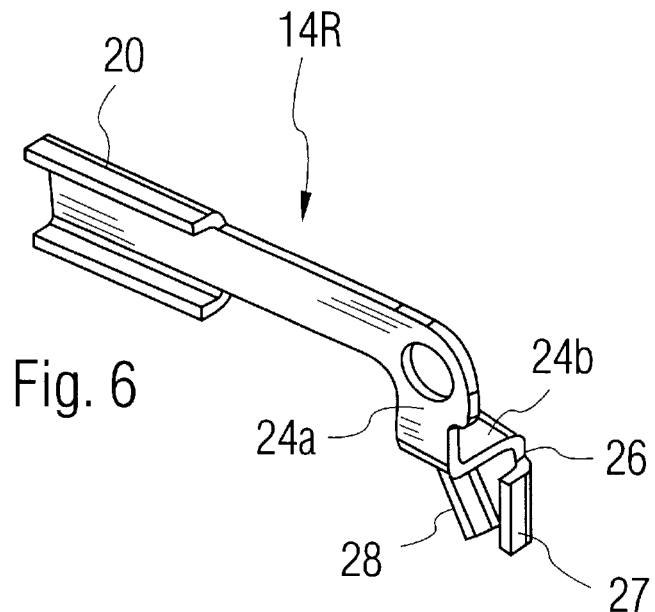
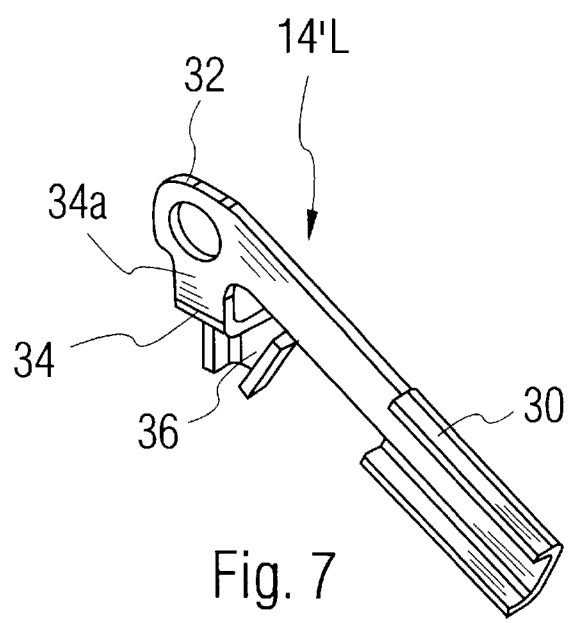

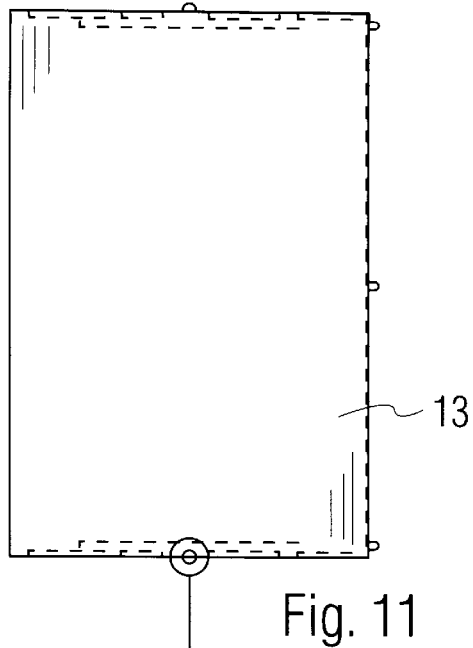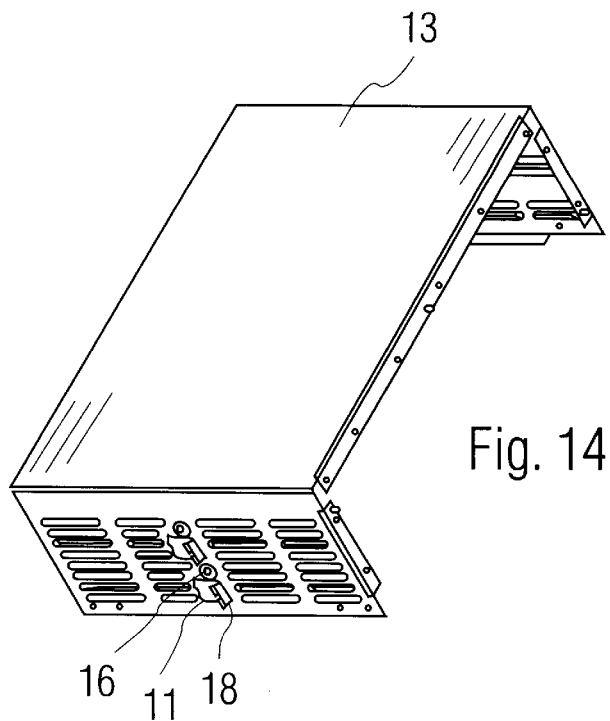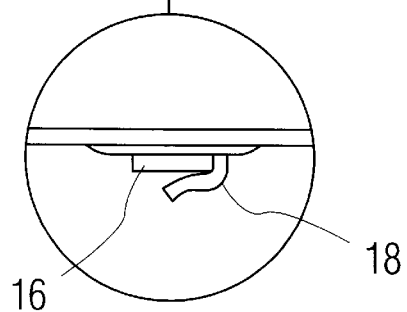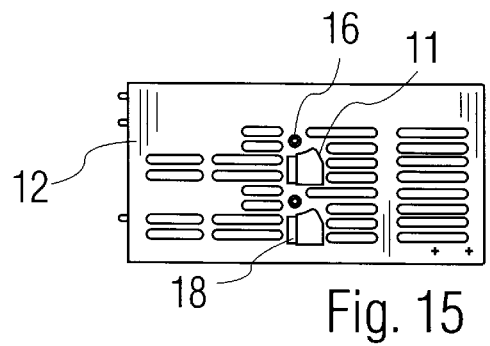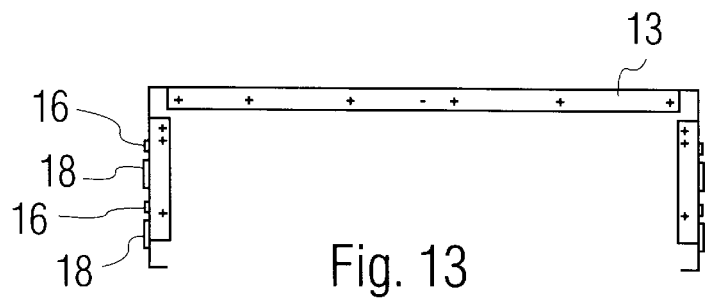

VIEW 1

VIEW 2

PCB EJECTOR CAGE ASSEMBLY

FIELD OF THE INVENTION

The invention relates to an ejector cage assembly and more particularly to a sheet metal ejector structure formed of a cage and a lever element.

BACKGROUND OF THE INVENTION

Printed circuit boards (PCBs) are typically positioned within a housing or cage for computer applications and communication applications such as local area network applications. The PCB is normally retained in the housing. The retaining of the PCB is often by fasteners which are fixed to the housing or cage or are otherwise connected to the housing or card cage. Preferably, such a connection allows the PCB to be securely fixed in position but also allows for a removal of the PCB, if replacement is necessary.

SUMMARY AND OBJECTS OF THE INVENTION

It is the primary object of the invention to provide a card cage and ejector mechanism assembly wherein each ejector is formed of a single sheet metal piece and the card cage is formed of one or more sheet metal pieces wherein no retaining fasteners are required for supporting the ejector and fixing it relative to the card cage for fixing a printed circuit board in position within the card cage.

According to the invention, a card cage ejector combination is provided including a card cage or housing for receiving printed circuit boards. The housing has an opening for insertion of the PCBs. The ejector mechanism is formed preferably with a single sheet metal piece including a lever/handle portion, a pivot portion, a PCB engagement portion and a transmission portion extending from the pivot portion to the PCB engagement portion. The card cage includes a pivot support which is formed by protruding a portion of the sheet metal of the card cage. The pivot portion of the ejector then cooperates with the protruding pivot support and the ejector level can pivot about the pivot support. A fixing portion is also formed from the sheet metal of the card cage. An opening is provided in the card cage adjacent to the pivot support and adjacent to the fixing portion. The PCB engagement portion of the ejector lever is inserted into the opening and the pivot portion is mounted on the pivot support. The ejector may be moved from a first non-fixed position, wherein the PCB board is not fixed, to a fixed position wherein the PCB board is fixed. In the fixed position, the fixing portion of the cage frictionally engages the ejector lever for maintaining it in position mounted on the pivot support. The ejector lever and card cage hold the PCB in a fixed position without the use of retaining fasteners for retaining the ejector relative to the card cage.

Preferably the card cage is provided with one or more PCB guides. The PCB guides assist in inserting the PCB within the card cage and position the PCB within the card cage.

The ejector lever is preferably provided with a lever/handle portion which connects to a pivot portion. The transmission portion preferably extends in a first direction from the pivot portion and then a second direction from the pivot portion. The two different directions allow the pivot portion to be supported outside of the card cage while the transmission portion extends into the opening of the card cage for supporting the PCB engagement element for fixing the PCB within the card cage. The PCB engagement element preferably includes a first engagement face and a second engagement face.

The PCB engagement element is disposed at an angle with respect to the lever portion, preferably spaced from the pivot portion in a first direction and spaced from the pivot portion in a second direction via the transmission portion. The angle of the lever with respect to the engagement portion is preferably less than ninety degrees. According to one embodiment of the invention, this angle is 85° and according to another embodiment of this invention, the angle is 65°.

The card cage fixing device, opening and pivot support form ejector lever receiving structure. Preferably an ejector lever receiving structure is provided on each side of the card cage for engagement by levers on two different sides of a PCB. The ejector lever receiving structure is preferably formed at two different portions of the same sheet metal piece which forms all or a portion of the card cage. Preferably more than one ejector receiving structure is provided on each side of the card cage. In the preferred embodiment, two ejector lever receiving structures are provided on each side of the card cage, each for receiving a PCB. Two cooperating ejector lever receiving structures further cooperate with PCB guides also formed out of the same sheet metal structure and provided within the card cage.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 5 is a top view of the ejector lever of FIG. 2;

FIG. 6 is a perspective view of an ejector lever which is the mirror image of the ejector of FIG. 2;

FIG. 7 is a perspective view of another ejector according to the invention;

FIG. 11 is a top view of the card cage;

FIG. 12 is a detail view showing the ejector lever receiving structure;

FIG. 13 is a rear end view of the card cage according to the invention;

FIG. 14 is a top left perspective view of the card cage according to the invention;

FIG. 15 is a left side view of the card cage according to the invention;

DESCRIPTION OF THE PREFERRED EMBODIMENT

Figure 1:
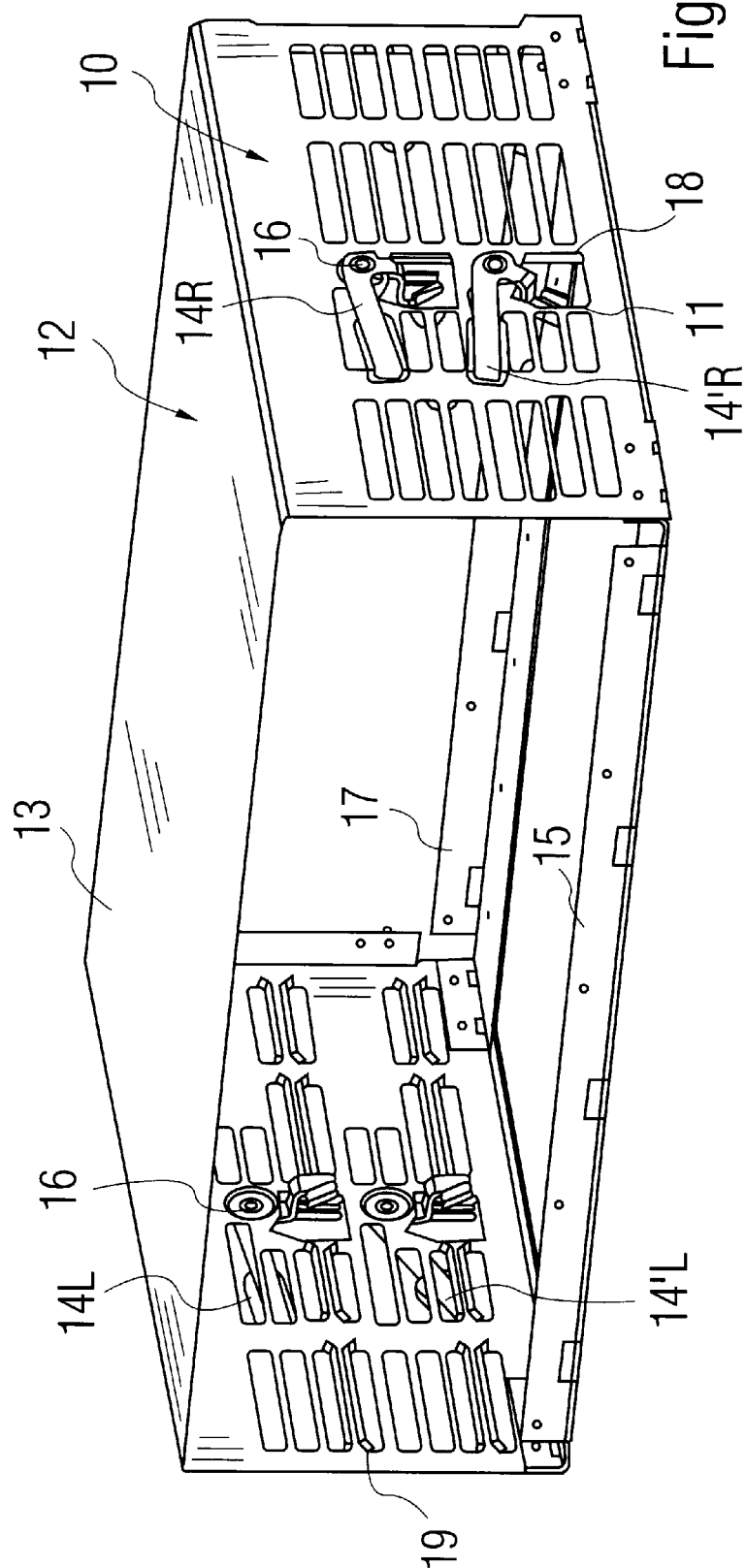
FIG. 1 is a perspective view showing the ejector and card cage assembly according to the invention.

Referring to the drawings in particular, the invention comprises an ejector and cage assembly generally designated 10. The assembly includes the cage 12 and two or more ejector levers 14L, 14R. The cage 12 may be a single sheet metal piece. The preferred embodiment of the cage 12 includes a single sheet metal piece 13 with front and rear support elements 15, 17. Elements 15, 17 and 13 together form the card cage. The single sheet metal piece 13 which forms the top and sides of the card cage 12 includes a plurality of openings 11. Additionally, in the interior of the card cage, the single sheet element 13 also provides PCB guides 19. As can best be seen in FIGS. 12, 13 and 14, the single sheet metal piece 13 has protruding portions which form pivot supports 16. Additionally, adjacent to the opening 11, there is formed integrally with sheet metal piece 13 a fixing element 18. The pivot support 16, the opening 11 and the fixing element 18 together form the ejector lever receiving structure.

Figure 2:
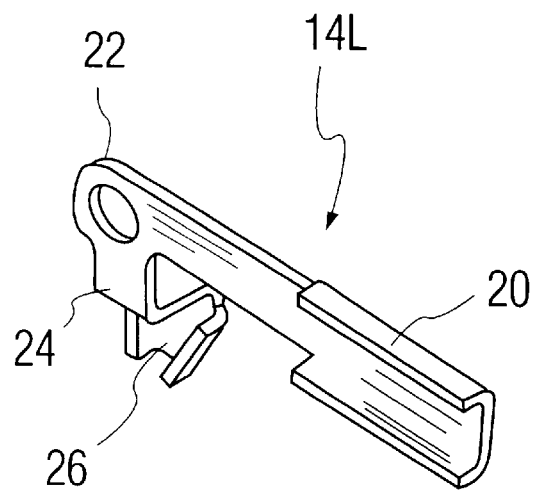
FIG. 2 is a perspective view of an ejector lever according to a first embodiment of the invention.
Figure 3:
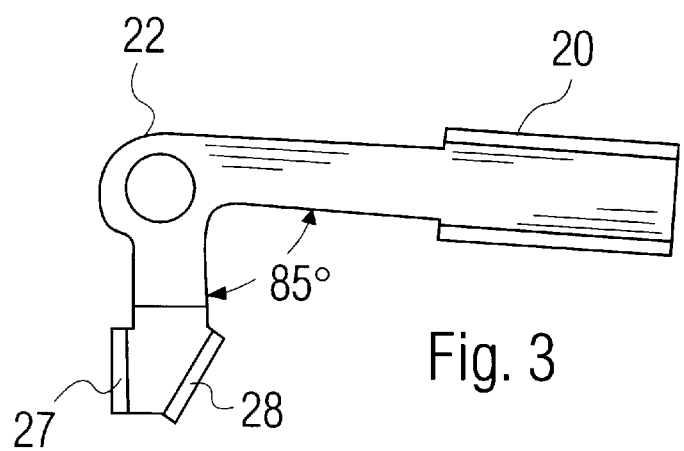
FIG. 3 is a side view of the ejector lever of FIG. 2.
Figure 4:
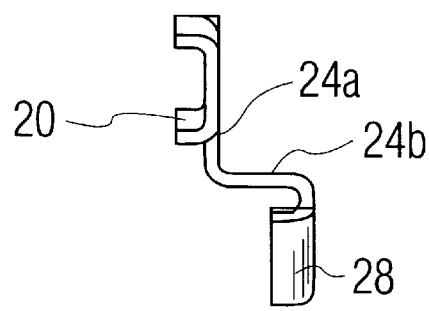
FIG. 4 is a front end view of the ejector lever of FIG. 2.
Figure 8:
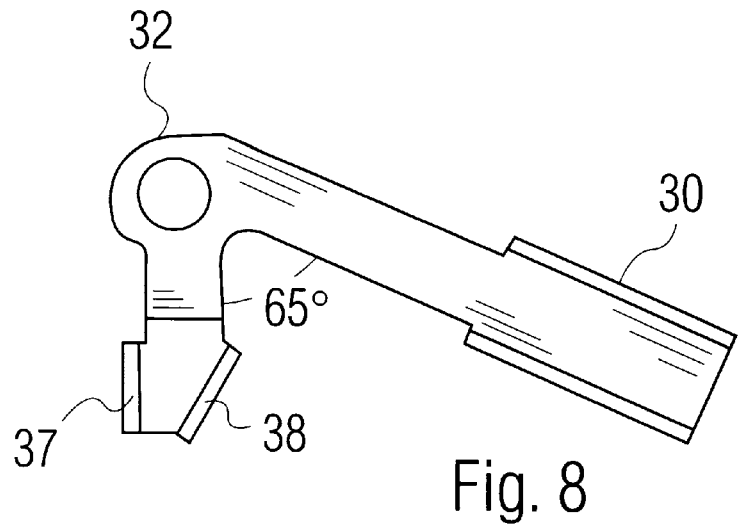
FIG. 8 is a side view of the ejector lever of FIG. 6.
Figure 9:
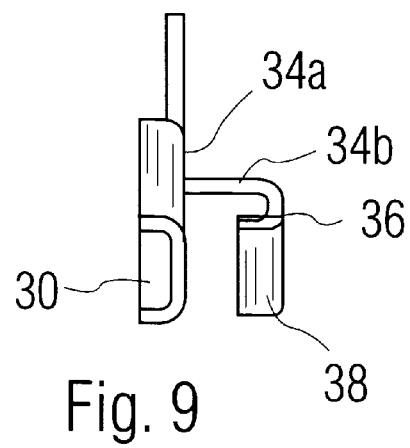
FIG. 9 is a front end view of the ejector lever of FIG. 6.
Figure 10:
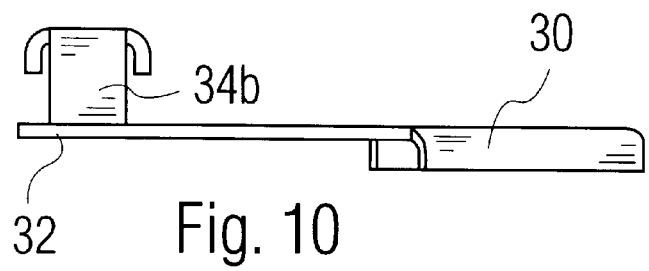
FIG. 10 is a top view of the ejector lever of FIG. 6.

FIG. 2 shows an ejector lever 14L according to a first embodiment of the invention. The ejector lever 14L includes a lever/handle portion 20, a pivot portion 22, a transmission portion 24 and a PCB engagement portion 26. The portions are all formed of an integral single sheet metal piece. As can be seen from FIGS. 2, 4 and 5, the transmission portion 24 includes a first downwardly directed length 24a (extending in a first direction) and another length 24b extending perpendicularly (inwardly into the cage). The PCB engagement portion 26 includes the first engagement face 27 and second engagement face 28.

FIGS. 2 through 5 show a lefthand side ejector lever 14L for use with the cage assembly 10 of FIG. 1. The righthand side lever 14R is shown in FIG. 6. The righthand side lever is substantially the same structurally as the lefthand side lever of FIG. 2 but it is the mirror image. As such the portion 24b of the lefthand side lever extends into opening 11 for use on a lefthand side of the ejector cage assembly 10 whereas the right side lever of FIG. 6 extends into opening 11 on the right side of the ejector and cage assembly 10. In each case the handle 20 extends in a forward direction.

FIGS. 7, 8, 9 and 10 show an alternative embodiment of a ejector lever 14'L. Ejector lever 14'L includes a lever/handle portion 30 connected to a pivot portion 32. The pivot portion 32 is connected to the transmission portion 34 which is in turn is connected to the PCB engagement portion 36. Transmission portion 34 includes a first downwardly directed length 34a and a laterally extending length 34b. The PCB engagement element 36 includes a first engagement face 37 and a second engagement face 38. The various portions of the ejector lever 14'L are formed as an integral unit from a single piece of sheet metal. The alternate ejector levers 14'L and 14'R provide an angle of 65° between the PCB engagement portion 36 and the lever/handle portion 30. The ejector lever 14 has an almost identical; design except the angle is 850. The ejector levers 14L and 14R are preferably used as top ejectors whereas the smaller angle (65° as opposed to 85°) of the ejector levers 14'L and 14'R make them suitable for being the lower ejector. As can be seen in FIG. 1, the smaller angle of ejector levers 14'R allows for sufficient space for the operation of both ejector lever 14'R and 14R.

The ejector lever 14'L shown in FIG. 7 is to be used on the left side of ejector and cage assembly 10. An ejector 14'R (see FIG. 1) which is the mirror image of the ejector in FIG. 7 can be used in a manner similar to ejector 14R, namely inserted in an opening 11 on the right side of the ejector and cage assembly 10.

FIG. 11 shows a top view of a single sheet metal piece 13 which forms the cage 12. As can be seen in this view on each side of the cage 12 there is at least one ejector lever receiving structure.

FIG. 12 shows a detailed top view of the ejector lever receiving structure. The ejector lever receiving structure includes the pivot support structure 16 as well as the fixing structure 18. The fixing structure or frictional engagement portion 18 is a piece bent out from a plane of the sheet metal piece 13, at a location adjacent to the opening 11. This defines a frictional engagement surface for engaging an ejector lever 14L or 14R (or 14L or 14'R) in a pivoted down or fixed position.

FIG. 13 shows a rear view of the sheet metal piece 13. Two ejector lever receiving structures are provided on each of two sides of the sheet metal piece 13. The position of the pivot support 16 relative to the fixing element 18 is shown. Pivot support 16 is preferably a protruding sheet metal portion of sheet metal piece 13.

FIG. 14 shows a right rear side perspective view of the sheet metal piece 13 which forms the card cage 12. This is a view of the side opposite the side shown in FIG. 1. The opening 11, pivot support 16 and fixing element 18 can all be seen in FIG. 14, namely the elements that form the ejector lever receiving structure. FIG. 15 shows, via an end view, the same structure of the card cage 12, namely two openings 11, two fixing elements 18 and two pivot supports 16, forming two different ejector lever receiving structures.

Figure 16:
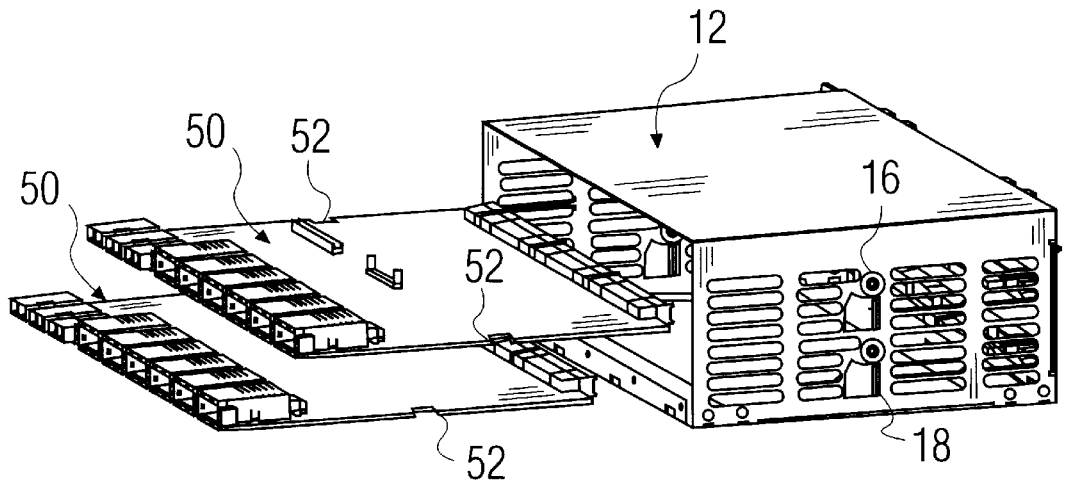
FIG. 16 is a perspective view showing the insertion of printed circuits boards into a card cage according to the invention.
Figure 17:
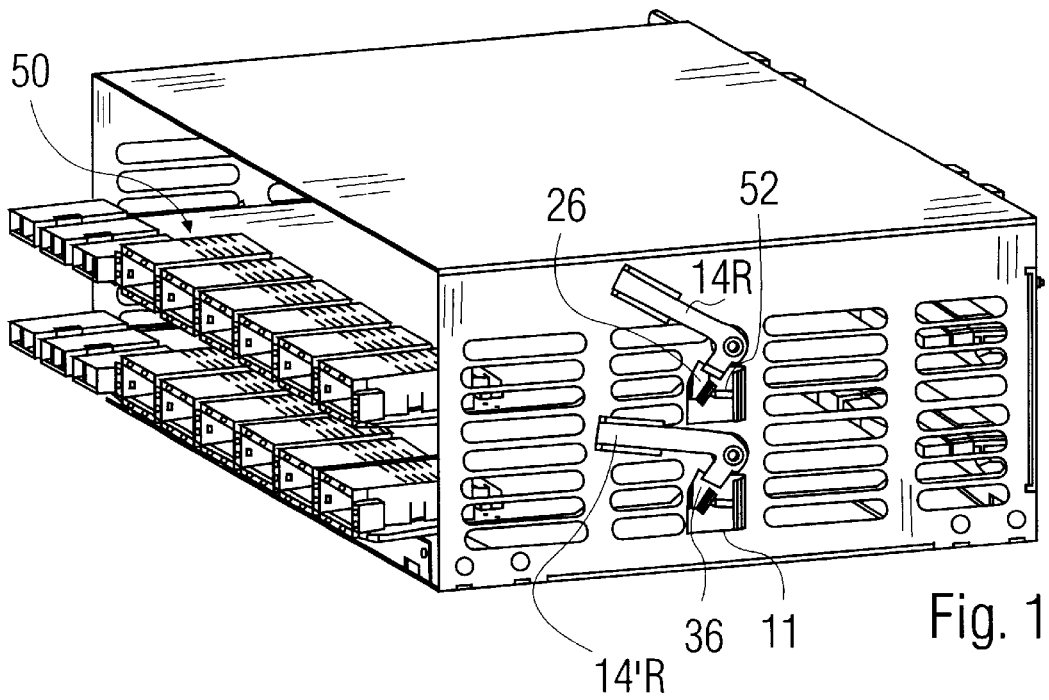
FIG. 17 is a view similar to FIG. 16, showing the insertion of two different right ejectors.
Figure 18:
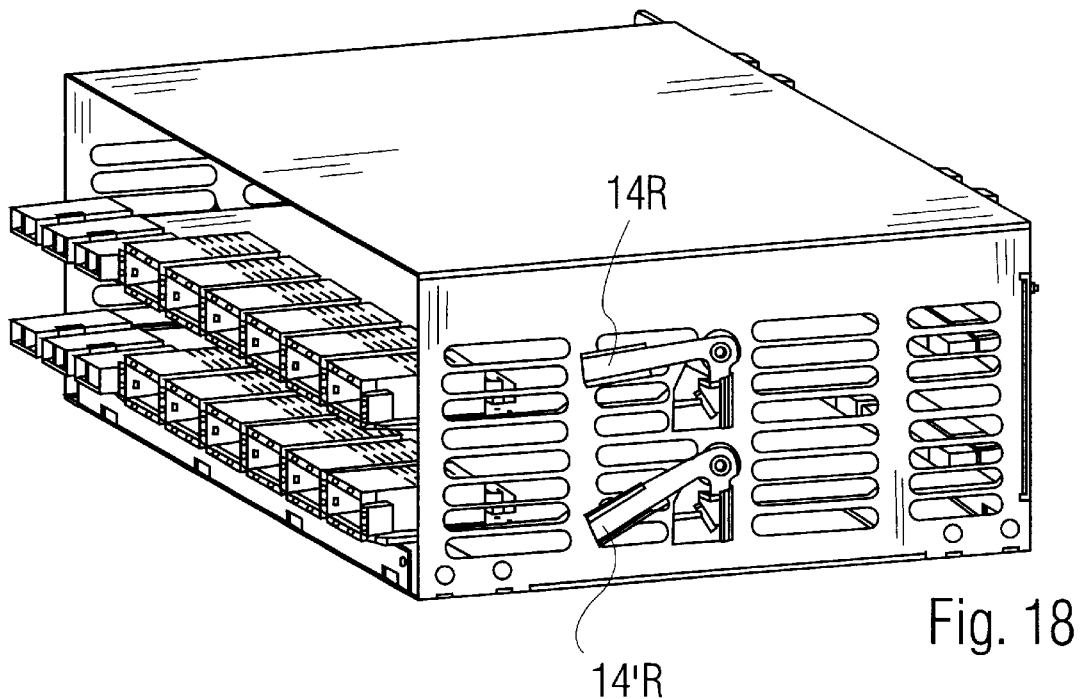
FIG. 18 is a view similar to FIG. 16, showing the two right ejectors moved into a fixed position.

FIGS. 16, 17 and 18 show the steps of inserting cards or PCBs into the cage 12 and the fixing of these. Specifically, as seen in FIG. 16, the cage 12 is provided and first and second PCBs are positioned with respect to guides 19 (upper and lower) and are inserted into cage 12 up to the point that you can insert the PCBs without the ejectors. As shown in FIG. 17, the ejectors (ejectors 14R and 14'R are shown) are inserted into openings 11. The ejectors are supported by pivot support 16 (see FIG. 16). In the position shown in FIG. 17 the PCB engagement portion 26 extends into the opening 11 and into a slot 52 provided in the associated PCB 50. The user of the device then applies pressure at the lever/handle portion 20 of an ejector 14L and an ejector 14R which moves the PCB via contact between PCB engagement portion 26 and slot 52, into its final position. The ejector 14R, in its final position is shown in FIG. 18. In this final engaged position, each ejector is retained by the slot 52 (formed in the PCB 50), the fixing element 18 (which frictionally engages a top surface of transmission portion 24, namely a side of length 24a) as well as the pivot support 16 (which is in the form of a stud or protuberance).

The alternate ejectors 14'R and 14'L are connected in the manner as described above. The alternate ejectors 14'L and 14'R are preferably used as an ejector for the lower PCB. The smaller angle between the lever/handle 30 and the transmission portion 34 (65° in this instance as opposed to 85° with regard to ejectors 14L and 14 R), is advantageous as to providing sufficient space for an ejector immediately above (namely space for the ejector 14).

In FIG. 1, four ejector lever receiving structures are provided with four ejector levers 14R, 14'R, 14L, 14'L. On the right side of FIG. 1, the top ejector lever is positioned in a fixed position with the fixing element 18 frictionally engaging a top surface of transmission portion 24. The frictional engagement of the portion 24 with the fixing element 18 in cooperation with the support of the pivot support 16 and the opening of pivot portion 22 provides a stable positioning and fixing of the ejector lever with respect to the card cage 12. This allows the PCB engagement portion 26 to effectively fix an inserted PCB.

On the right side of FIG. 1, the lower ejector lever receiving structure is cooperating with another ejector lever 14'R. In this instance, the ejector lever 14'R is supported by the pivot support 16 but in a non-fixed position (there is no frictional engagement between fixing element 18 and portion 24).

While specific embodiments of the invention have been shown and described in detail to illustrate the application of the principles of the invention, it will be understood that the invention may be embodied otherwise without departing from such principles.

What is claimed is:

1. A printed circuit board (PCB) ejector card cage combination, comprising:
    a card cage with an ejector lever receiving structure; and
    an ejector lever including
        a lever portion,
        a pivot portion connected to said lever portion,
        a PCB engagement element, and
        a transmission portion extending from said pivot portion to said PCB engagement element, said ejector lever being formed as a single integral element and said lever receiving structure being formed of a single integral element forming an opening and an adjacent pivot support for supporting pivotal movement of said ejector lever relative to said card cage and for inserting the PCB into said card cage without the use of an additional fastening element, said pivot support including a pivot support portion.

2. The PCB engagement element ejector card cage combination, according to claim 1, wherein said PCB engagement element includes a first PCB engaging face and a second PCB engaging face, said first PCB engaging face being at an angle relative to said second PCB engaging face, said PCB engagement element being at a location at an angle with respect to said lever portion, spaced from said pivot portion in a first direction and spaced from said pivot portion in a second direction.

3. The PCB engagement element ejector card cage combination, according to claim 1, wherein said card cage is provided with one or more PCB guides for receiving and guiding the PCB within the card cage and positioning the PCB within the card cage.

4. The PCB ejector card cage combination, according to claim 1, wherein said pivot support includes a frictional fixing portion formed of a sheet metal piece bent out of a plane of surrounding sheet metal.

5. The PCB ejector card cage combination, according to claim 4, wherein said pivot support is a protruding portion formed of a bent out sheet metal.

6. The PCB ejector card cage combination, according to claim 4, wherein said frictional fixing portion is a sheet metal piece bent out of a plane of surrounding sheet metal.

7. The PCB ejector card cage combination, according to claim 4, wherein said ejector lever is inserted into said opening with said pivot portion supported by said pivot support portion and at least another portion of said ejector lever positioned for moving into and out of engagement with said frictional fixing portion.

8. The PCB ejector card cage combination, according to claim 7, wherein said PCB engagement element is at a location at an angle with respect to said lever portion, spaced from said pivot portion in a first direction and spaced from said pivot portion in a second direction.

9. The PCB ejector card cage combination, according to claim 7, wherein said transmission portion extends through said opening and includes a first length extending in said first direction from said pivot portion and a second length extending in said second direction.

10. The PCB ejector card cage combination according to claim 1, wherein the said ejector is a right side ejector and a left side ejector is provided which is substantially the mirror image of said right side ejector.

11. The PCB ejector card cage according to claim 10, wherein said left side ejector and said right side ejector are for an upper PCB and a lower right side ejector and lower left side ejector are provided for a lower PCB.

12. The PCB ejector according to claim 11, wherein said upper left side ejector and upper right side ejector define an angle between said lever portion and said transmission portion substantially equal 85°.

13. The PCB ejector according to claim 11, wherein said lower left side ejector and lower right side ejector define an angle between said lever portion and said transmission portion substantially equal 65°.

14. A card cage ejector for a printed circuit board (PCB), comprising:
    a housing for receiving printed circuit boards (PCBs), the housing having an opening for insertion of the PCBs, a sheet metal piece with a protruding portion forming a pivot support, an ejector opening adjacent to said pivot support and a portion of said sheet metal piece bent out forming a fixing portion;
    an ejector mechanism formed of a single sheet metal piece including a lever/handle portion, a pivot portion, a PCB engagement portion and a transmission portion extending from said pivot portion to the PCB engagement portion, said pivot portion of said ejector mechanism cooperating with said pivot support whereby said ejector lever pivots about the pivot support for movement from a non-fixed position, wherein the PCB is not fixed, to a fixed position wherein the PCB is fixed and wherein the fixing portion of the cage frictionally engages said ejector mechanism for maintaining said ejector mechanism in position mounted on the pivot support and wherein said ejector mechanism and said card cage hold the PCB in a fixed position without the use of retaining fasteners for retaining the ejector relative to the card cage.

15. A printed circuit board (PCB) ejector card cage combination, comprising:
    a card cage with an ejector lever receiving structure formed of a single piece, said single piece forming at least a part of said card cage; and
    an ejector lever formed of a single piece not fixed to the PCB, said ejector lever including
        a lever portion,
        a pivot portion fixed to said lever portion,
        a PCB engagement element, and
        a transmission portion extending from said pivot portion to said PCB engagement element, said ejector lever receiving structure having an opening and an adjacent pivot support portion for engaging said pivot portion of said ejector lever relative to said card cage for supporting said ejector lever based on contact between said ejector lever and said ejector lever receiving structure single sheet metal piece.

16. The PCB ejector card cage combination, according to claim 15, wherein said ejector lever single piece is a single sheet metal piece and said card cage single piece is a single sheet metal piece.

17. The PCB ejector card cage combination, according to claim 15, wherein said pivot support portion is a protruding portion formed of a bent out sheet metal.

18. The PCB ejector card cage combination, according to claim 15, wherein said card cage includes a fixing surface formed of a sheet metal piece bent out of a plane of surrounding sheet metal of said ejector lever receiving structure single sheet metal piece, said fixing surface for fixing a position of said ejector lever relative to said card cage.

* * * * *